United States Patent [19]
Van Veenendaal

[11] Patent Number: 5,434,544
[45] Date of Patent: Jul. 18, 1995

[54] OSCILLATOR

[75] Inventor: Hendrik G. Van Veenendaal, Eindhoven, Netherlands

[73] Assignee: U.S. Philips Corporation, New York, N.Y.

[21] Appl. No.: 300,683

[22] Filed: Sep. 2, 1994

[30] Foreign Application Priority Data

Sep. 6, 1993 [BE] Belgium .............. 09300914

[51] Int. Cl.⁶ .................... H03B 5/12; H03B 5/04
[52] U.S. Cl. .................... 331/117 R; 327/292; 330/250; 331/175
[58] Field of Search ........... 331/113 R, 117 R, 116 R, 331/117 FE, 116 FE, 144, 175; 327/185, 291, 292, 589; 330/250, 254, 260, 278, 281, 282, 283, 291, 292, 294

[56] References Cited

U.S. PATENT DOCUMENTS

| | | | |
|---|---|---|---|
| 2,947,949 | 8/1960 | Nakamura | 331/144 |
| 4,199,695 | 4/1980 | Cook et al. | 327/589 X |
| 4,239,991 | 12/1980 | Hong et al. | 327/231 X |
| 4,255,723 | 3/1981 | Ebihara | 331/116 FE |
| 4,587,497 | 5/1986 | Keller et al. | 331/116 R |
| 4,876,462 | 10/1989 | Kobatake et al. | 327/536 |
| 4,894,559 | 1/1990 | Kaneko | 327/589 X |
| 5,081,430 | 1/1992 | Kohsiek | 331/113 R X |
| 5,187,450 | 2/1993 | Wagner et al. | 331/96 |
| 5,198,784 | 3/1993 | Fenk | 331/117 R |

FOREIGN PATENT DOCUMENTS 2021708  1/1990  Japan .............. H03B 5/12

*Primary Examiner*—David Mis
*Attorney, Agent, or Firm*—Edward W. Goodman

[57] ABSTRACT

An oscillator which inhibits unwanted oscillations and requires a comparatively small power supply voltage is described. The oscillator includes an amplifier transistor 110 (220), an output current of which flows into the emitter of a load transistor 120 (220) via a load signal path. The amplifier stage acquires a bandpass characteristic by a passive capacitive bootstrap signal transfer from this signal path to the base of the load transistor. The oscillator thus preferably oscillates within the passband of the amplifier stage. The amplifier stage has a comparatively large gain within the passband even without a load resistor in the load signal path. Such a load resistor would cause a voltage drop and, hence, increase the required power supply voltage.

20 Claims, 9 Drawing Sheets

OSCILLATOR

BACKGROUND OF THE INVENTION

The invention relates to an oscillator including a resonator which is coupled to an amplifier stage comprising an amplifier transistor and a load transistor, a load signal path from a collector of the amplifier transistor to an emitter of the load transistor, to which load signal path the resonator is coupled, and a bootstrap signal transfer from the load signal path to the base of the load transistor, which base is coupled to a reference voltage conductor via a bias resistor.

An oscillator of this type is known per se from Japanese Patent publication Kokai 2-21708. FIG. 1 shows the known oscillator. An amplifier stage of the type described in the opening paragraph comprises Q2 as an amplifier transistor and Q5 as a load transistor. The base of the load transistor Q5 is coupled to the positive power supply voltage via bias resistor R7. The load signal path from the collector of Q2 to the emitter of Q5 comprises a load resistor R2. Resonator 15 is coupled to the load signal path. The bootstrap signal transfer from the load signal path to the base of Q5 (point 17) is effected from the collector of Q2 (point 11) and proceeds via transistor Q4, emitter resistors R6 and R5 and transistor Q3 which constitute a differential stage. Together with transistor Q5 and load resistor R2, this differential stage constitutes a local positive feedback loop. Resonator 15, coupling capacitors C2 and C3, driver transistor Q1 and the amplifier stage form part of an oscillation loop.

The known oscillator can start oscillating at a frequency determined by the resonator. To this end, the amplifier stage is to compensate for the signal losses which occur in the resonator 15 and the coupling capacitors C2 and C3 so that the loop gain in the oscillation loop is larger than one.

A practical resonator generally has different resonance frequencies, for example, because the elements of the resonator comprise unwanted reactances such as a self-inductance caused by the connection terminals in a capacitor, or, for example as a result of inductive and capacitive couplings between two different conductors. An illustrative example is a soldering point on a conductor constituting a capacitance of approximately 0.5 picoFarad to a proximate conductor.

Resonator 15 of the known oscillator may be, for example, an LC circuit provided with varicap diodes, used in a UHF television tuner. FIG. 2a illustrates the attenuation T(R) of the positive feedback network in the known oscillator constituted by such a resonator 15 and coupling capacitors C2 and C3. Resonator 15 has three resonance frequencies (f1, f2 and f3) at which the resonator has a maximum impedance and the attenuation T(R) is consequently minimal. The desired resonance frequency is f2, and f1 and f3 are parasitic resonance frequencies. FIG. 2b shows the gain T(A) of the amplifier stage with driver transistor Q1. FIG. 2c shows the resultant loop gain of the oscillation loop T(L).

Outside frequency f2, the known oscillator may also start oscillating at frequency f1 or f3 because the loop gain of the oscillation loop at these frequencies is larger than once. Moreover, the known oscillator may have an unwanted relaxation oscillation. If resonator 15 is removed from the oscillator shown in FIG. 1, the latter will function as a relaxation oscillator. In this case, the coupling capacitors C2 and C3 are periodically charged and discharged by the amplifier stage which behaves as a current switch. If resonator 15 is incorporated in the oscillator circuit, as is shown in FIG. 1, the relaxation oscillation may still occur. This risk notably exists when the loop gain in the oscillation loop at the relaxation oscillation frequency is approximately equal to or larger than that at the desired resonance frequency.

In the known oscillator, the voltage difference between the collector of amplifier transistor Q2 and the power supply voltage is comparatively large. Comparatively large direct currents flow through the load resistor R2 in the load signal path as well as through the bias resistor R7 which couples the base of transistor Q5 to the power supply voltage. To prevent saturation of transistor Q2, the known oscillator requires a comparatively high power supply voltage.

The difference between available power supply voltage and the minimally required oscillator power supply voltage may be so small that the oscillator power supply voltage cannot be taken from a voltage stabilizer. Generally, this is desired. First, an unwanted detuning of the oscillation frequency due to a change of the available power supply voltage is thereby reduced. Secondly, a voltage stabilizer suppresses the transfer of alternating voltages in the available power supply voltage to the oscillator power supply voltage supplied by the voltage stabilizer. Such alternating voltages may modulate the oscillator in an unwanted manner, so that the output signal will comprise unwanted spectral components.

SUMMARY OF THE INVENTION

It is an object of the invention to provide an oscillator of the type described in the opening paragraph, which oscillator inhibits oscillation at an unwanted frequency and for which a lower power supply voltage than that for the known oscillator is sufficient.

To this end the oscillator according to the invention is characterized in that the bootstrap signal transfer is mainly determined by a passive capacitive coupling of the base of the load transistor to the load signal path. Such a passive capacitive coupling comprises at least the emitter-base capacitance of the load transistor.

The invention is based on the recognition that the amplifier stage thereby acquires a band-pass character which is determined, inter alia, by the passive capacitive coupling. Unwanted oscillations are inhibited by adjusting the passband of the amplifier stage near the desired oscillation frequency. The loop gain of the oscillation loop at parasitic resonance frequencies may therefore be considerably smaller in the oscillator according to the invention than in the known oscillator. By decreasing the loop gain outside the band of desired oscillation frequencies, unwanted relaxation oscillations can also be prevented. A relaxation oscillation frequency is generally an order of magnitude smaller than a desired oscillation frequency determined by the resonator.

FIGS. 3a, 3b and 3c illustrate this. FIG. 3a shows the signal transfer T(R) of a practical resonator with coupling capacitors, identical to FIG. 2a. FIG. 3b shows the signal transfer T(A') of the other elements of the oscillation loop in an oscillator according to the invention. FIG. 3c shows the loop gain T(L') of the oscillation loop of an oscillator according to the invention. According to FIG. 3c, an oscillation can only occur at frequency f2; at frequencies f1 and f3 the loop gain of the loop transfer will remain smaller than one.

The invention utilizes, inter alia, the fact that the gain of an amplifier stage of the type described in the opening paragraph is determined to a considerable extent by the amplitude and phase of the bootstrap signal transfer. The amplifier transistor converts an input voltage of the amplifier stage into a collector output current, with a conversion factor to be indicated as amplifier transadmittance. The gain of the amplifier stage; is approximately equal to the product of this amplifier transadmittance and the load impedance at the collector of the amplifier transistor. As the amplitude of the bootstrap signal transfer approximates the value of one and the phase approximates the value of zero, this load impedance increases, and thus the gain increases as well.

In the known oscillator, the bootstrap signal transfer is substantially frequency-independent and consequently, the gain of the amplifier stage is frequency-independent as well. In the oscillator according to the invention, the bootstrap signal transfer is frequency-dependent to a considerable extent, so that the amplifier acquires a band-pass character.

The high-pass slope of the band-pass characteristic is produced in that the bias resistor mentioned in the opening paragraph and the passive capacitive coupling constitute a passive high-pass filter at comparatively low frequencies. FIG. 4a illustrates this, in which transistor 120 is the load transistor of the amplifier stage mentioned in the opening paragraph, resistor 130 is the bias resistor mentioned in the opening paragraph and the capacitor denoted by "$C_{BE}$" ensures the capacitive bootstrap signal transfer from the load signal path 180. At an increasing frequency, the attenuation of the bootstrap signal transfer across the passive capacitive coupling decreases and consequently the gain of the amplifier stage increases.

The passband of the amplifier stage is located in a bootstrap frequency band at which the impedance of the collector-base capacitance of the load transistor approximates the impedance of the afore-mentioned bias resistor. In the bootstrap frequency band, the attenuation across the passive capacitive coupling is substantially frequency-independent and comparatively small. This is because the bootstrap signal transfer is mainly determined by the afore-mentioned collector-base capacitance and the passive capacitive signal coupling which jointly constitute a capacitive voltage divider as is shown in FIG. 4b, in which the collector-base capacitance is denoted by "$C_{BC}$".

The low-pass slope is determined, inter alia, by the finite cut-off frequency of the transistors of the amplifier stage. If the emitter-base capacitance of the load transistor mainly constitutes the passive capacitive coupling, the low-pass slope is almost completely determined by the finite cut-off frequency.

The invention is further based on the recognition that an oscillator designed for mass production with a passive capacitive bootstrap signal transfer requires a smaller power supply voltage for supplying the amplifier stage gain required for an oscillation as compared with the known oscillator which comprises an active bootstrap signal transfer. As the amplitude of the bootstrap signal transfer approximates the value of one, the gain of the amplifier stage increases. However, if the amplitude of the bootstrap signal transfer is larger than one, the oscillator may reach an unwanted state.

The bootstrap signal transfer produces a local positive feedback loop which comprises the load transistor. The loop gain of this positive feedback loop, in which the load transistor can be considered as an emitter-follower, is approximately equal to the amplitude of the bootstrap signal transfer. If this loop gain is larger than one, for example, driver transistor Q1 or amplifier transistor Q2 may be turned off in the known oscillator; the bias current from current source I1 flows completely through Q2 and Q1, respectively. Oscillation at the frequency determined by the resonator is then no longer possible because the oscillation loop is interrupted, as it were.

In the known oscillator, there is a risk that the loop gain in the local positive feedback loop will become larger than one due to a spread of the characteristics of the components. As the amplitude of the active bootstrap signal transfer at nominal component characteristics is smaller, there is a decreasing risk that a mass-produced oscillator can reach an unwanted state at the expense of the gain of the amplifier stage. In order to obtain the gain required for the desired oscillation, a load resistor having a sufficiently large value is to be incorporated in the load signal path, for example, load resistor R2 in FIG. 1.

In a mass-produced oscillator according to the invention, having a passive capacitive bootstrap signal transfer, the loop gain of the local positive feedback loop remains smaller than one. The passive capacitive coupling constitutes a voltage divider which can only attenuate the signal to be transmitted from the load signal path to the base of the load transistor. At nominal component characteristics, the amplitude of the bootstrap signal transfer can approximate the value of one comparatively closely to a desired resonance frequency. As compared with the known oscillator, an oscillator according to the invention requires a smaller load resistance for obtaining an amplifier stage gain required for an oscillation. Consequently, the voltage drop across the load resistor may be smaller so that a smaller power supply voltage than that for the known oscillator is sufficient for the oscillator according to the invention.

An embodiment of the oscillator according to the invention is further characterized in that a bootstrap capacitor is arranged between the base terminal and the emitter terminal of the load transistor. Consequently, the low-pass edge of the band-pass characteristic of the amplifier stage may extend through frequencies which are considerably lower than the cut-off frequency of the transistors. Moreover, a comparatively small passband, can be obtained, within which passband the amplifier stage has a comparatively large gain.

This embodiment is based on the recognition that the phase of the bootstrap signal transfer in the previously mentioned bootstrap frequency band varies to a comparatively large extent with such a bootstrap capacitor, due to a base resistor between the base terminal and the physical base of the load transistor. The afore-mentioned phase may then be substantially zero through a comparatively small frequency band. In this frequency band, the gain of the amplifier stage peaks, which constitutes the passband of the amplifier stage. Above this frequency band, the amplitude of the bootstrap signal transfer remains substantially constant but the phase differs to a greater extent from the value of zero. Consequently, the gain of the amplifier stage decreases with an increasing frequency, which results in a low-pass edge.

As is shown in FIG. 4c, the passive capacitive coupling in this embodiment comprises at least two signal paths: signal path "A" which comprises the emitter-base capacitance denoted by "$C_{BE}$" and signal path "B" which comprises bootstrap capacitor 140. In signal path "B", this capacitor is arranged in series with the base resistor "$R_{BB}$". Consequently, signal path "B" has a resonance frequency above which this signal path has a mainly resistive character. This is in contrast to signal path "A" which has a capacitive character, also for comparatively higher frequencies than the afore-mentioned resonance frequency. Consequently, the phase of the bootstrap signal transfer in the bootstrap frequency band may vary to a comparatively large extent. The frequency at which the phase approximates the value of zero most closely and hence the location of the passband is determined, inter alia, by the bootstrap capacitor.

A further embodiment of the oscillator according to the invention is characterized in that at least one bootstrap capacitor is adjustable by means of a frequency control signal. The location of the passband of the amplifier stage can thereby be adapted to the desired resonance frequency of a resonator tunable with a frequency control signal.

A further embodiment of the oscillator according to the invention is characterized in that a device for DC biasing of the amplifier stage is adjustable by means of a frequency control signal. The gain of the amplifier stage can thereby be adapted so as to compensate for variations of the attenuation of the positive feedback network at the desired resonance frequency upon detuning of the resonator. This embodiment utilizes the fact that the gain depends on the bias current of the amplifier transistor and the load transistor.

A further embodiment is characterized in that the collector of the load transistor is coupled to an output terminal or the oscillator, which collector is coupled to a reference voltage conductor via a read resistor. A read voltage is produced by causing the oscillator signal-modulated collector current of the load transistor to flow through the afore-mentioned read resistor. The load transistor then also functions as a buffer stage, which inhibits an unwanted influence of the oscillator by the circuits coupled to the read resistor. An oscillator, in which a read resistor is arranged between the collector of the load transistor and the reference voltage conductor, does not require a higher power supply voltage than an oscillator without such a resistor. By incorporating a read resistor, the collector voltage of the load transistor decreases, but the collector voltage of the amplifier transistor remains substantially equal because the base voltage of the load transistor is substantially not influenced thereby.

BRIEF DESCRIPTION OF THE DRAWINGS

These and other aspects of the invention will be apparent from and elucidated with reference to the embodiments described hereinafter.

In the drawings.

DETAILED DESCRIPTION OF THE PREFERRED EMBODIMENTS

Figure 5:
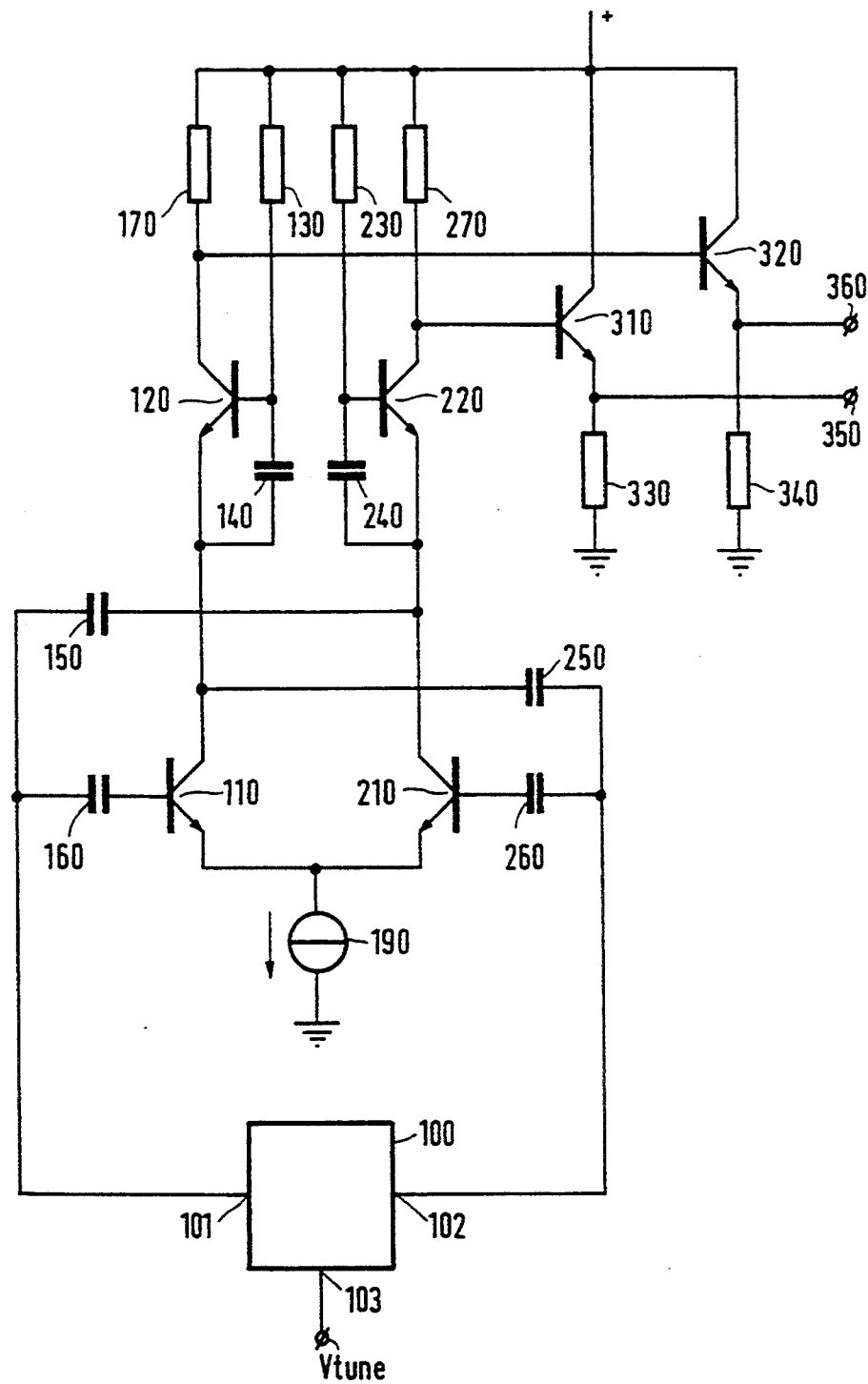
FIG. 5 shows an embodiment of an oscillator according to the invention.

The embodiment of an oscillator according to the invention, shown in FIG. 5, will hereinafter be described to elucidate the invention. In FIG. 5, the components which are not important for understanding the invention have been omitted, for example, components for DC biasing of the bases of amplifier transistors 110 and 210.

FIG. 5 shows an oscillator in which the oscillation loop comprises two amplifier stages in a balanced or differential configuration. Amplifier transistors 110 and 210 constitute a differential pair. Resonator 100 and coupling capacitors 150, 160, and 260 constitutes a differential positive feedback network. The balanced amplifier stages amplify a differential voltage between the bases of amplifier transistors 110 and 210 to a differential collector voltage. This differential collector voltage is fed back to the base tern finals of the amplifier transistors via the positive feedback network. Oscillation is possible at frequencies at which the differential base voltage thus fed back is in phase with the original differential base voltage. The loop gain in the oscillation loop, the product of the gain by the balanced amplifier stages, and the attenuation of the differential positive feedback network, should then be larger than one.

The oscillator further comprises a differential output amplifier which applies the differential oscillator signal, available between the read resistors 170 and 270, to the output terminals 350 and 360. Read resistors 170 and 270 are chosen to be such that the differential oscillator signal available between these resistors has a sufficiently large amplitude without the load transistors 120 and 220 being driven into saturation. A voltage drop across the read resistors of approximately 0.2 volt in an oscillator with bipolar load transistors is feasible. The differential output amplifier comprises the transistors 310 and 320 arranged as an emitter-follower and resistors 330 and 340. Also due to the buffer effect of the load transistors and the differential output amplifier, the tuning range and the frequency stability are comparatively independent of a circuit coupled to the output terminals.

In contrast to the known oscillator, the load signal paths of the embodiment shown in FIG. 5 do not incorporate load resistors. The collectors of the amplifier transistors 110 and 210 are connected substantially without any resistance to the emitters of the respective load transistors 120 and 220. Consequently, the oscillator according to the invention, shown in FIG. 5, is particularly suitable for low power supply voltage operation, for example at 2.3 volt.

Referring to FIG. 5, the bootstrap signal transfer in each of the balanced amplifier stages is determined by a bias resistor 130 or 230 and a passive capacitive coupling between the base of the load transistor and the collector of the amplifier transistor. This passive capacitive coupling comprises the internal emitter-base capacitance of the load transistor and a bootstrap capacitor (140 or 240) arranged between the emitter terminal and the base terminal. Since the bootstrap signal transfer is realized without active components, the current consumption as well as the manufacturing cost may turn out to be lower than those of the known oscillator.

The load impedance at the collectors of the amplifier transistors is very much dependent on the frequency. At comparatively low frequencies, the passive capacitive couplings have a very large impedance as compared with the impedance of the bias resistors 130 and 230. The signal voltage at the bases of load transistors 120 and 220 is then substantially zero. The load impedance is then approximately equal to the emitter differential resistance of transistors 120 and 220, so that the gain of the balanced amplifier stages is approximately one.

At an increasing frequency, the load impedance increases at which the gain reaches a peak value at a frequency determined, inter alia, by the bias resistors and the bootstrap capacitors. The (theoretical) case of the amplitude of the bootstrap signal transfer becoming exactly "1" and the phase becoming "0" at the last-mentioned frequency will hereinafter be illustrated. The signal voltage at the base of load transistor 120 (220) is then identical to the signal voltage at the collector of the amplifier transistor 110 (210). Since there is no signal voltage difference across the emitter-base junction of load transistor 120 (220), no signal current can flow through this load transistor. Load transistor 120 (220) then constitutes an infinitely large impedance.

Figure 3A:
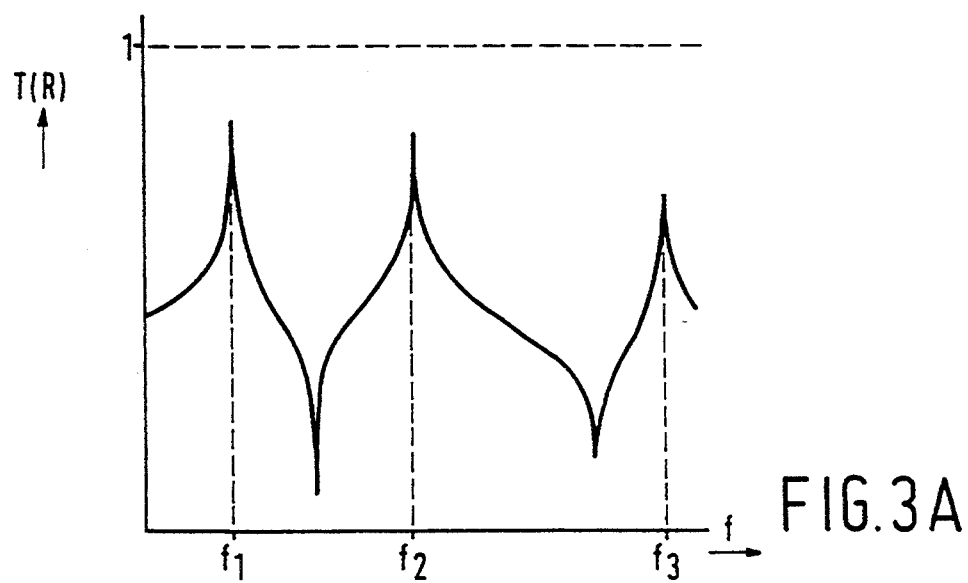
FIGS. 3A–3C show signal transfers in the oscillation loop of an oscillator according to the invention.

A practical embodiment of the oscillator shown in FIG. 5, for use in a UHF television tuner, has been realized in a 5 GHz "Subilo-N" Philips IC process. Resonator 100 was a known LC circuit provided with varicap diodes and tunable to a frequency control signal applied to terminal 103 and denoted in FIG. 5 by "Vtune" between 470 and 900 MHz. In addition to the desired resonance, this resonator had two unwanted resonances, as is shown in FIG. 3a. At a desired resonance frequency f2 of 600 MHz, the unwanted resonance frequency f1 was at approximately 300 MHz and f3 was at approximately 3 GHz. Near these resonance frequencies the resonator impedance between the terminals 101 and 102 of the resonator 100 peaked to a local maximum value and consequently the positive feedback network attenuation fell to a local minimum. The loop gain in the oscillation loop consequently showed local maxima near resonance frequencies f1, f2 and f3.

Figure 3B:
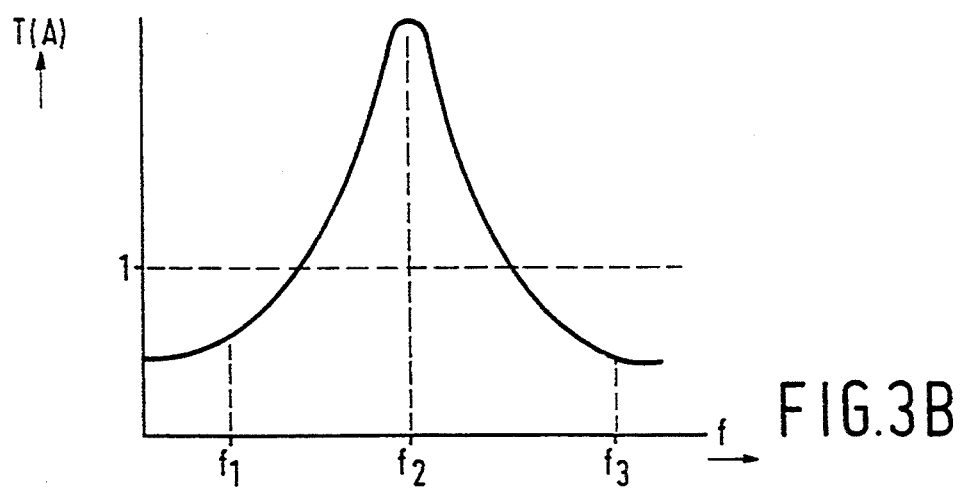
Figure 3C:
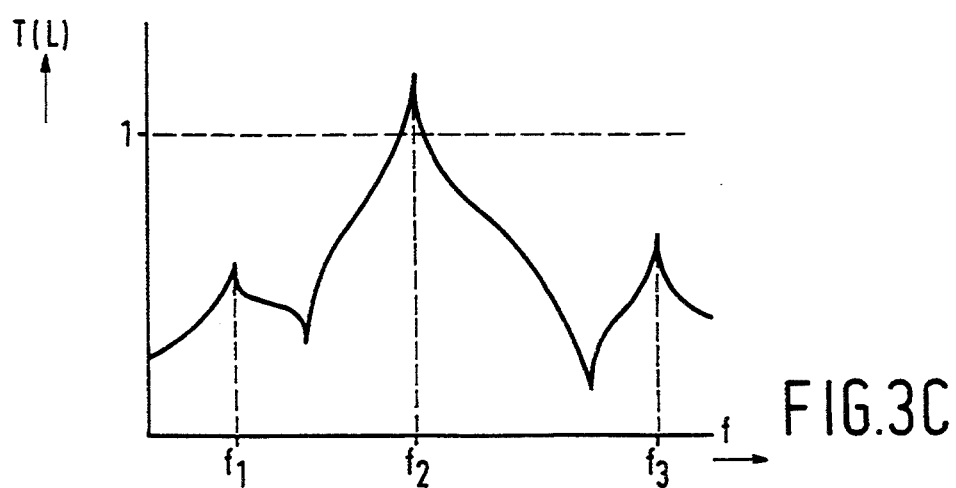
Figure 4A:
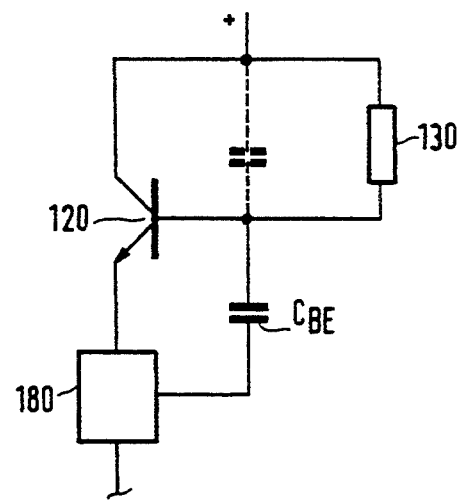
FIGS. 4A–4C show network models to elucidate the invention.
Figure 4B:
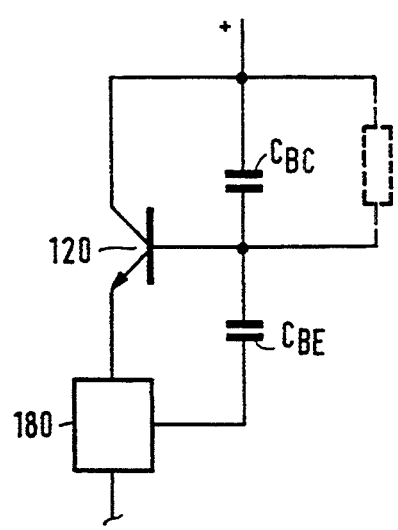
Figure 4C:
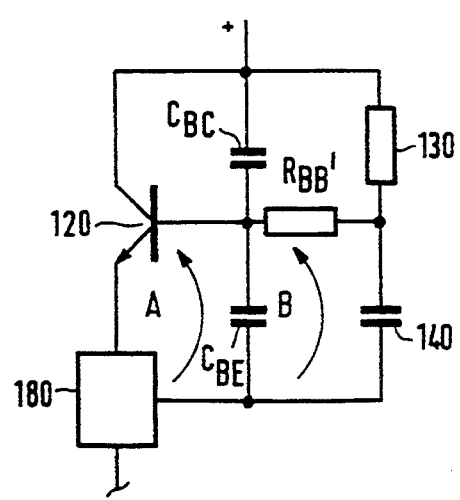
Figure 6:
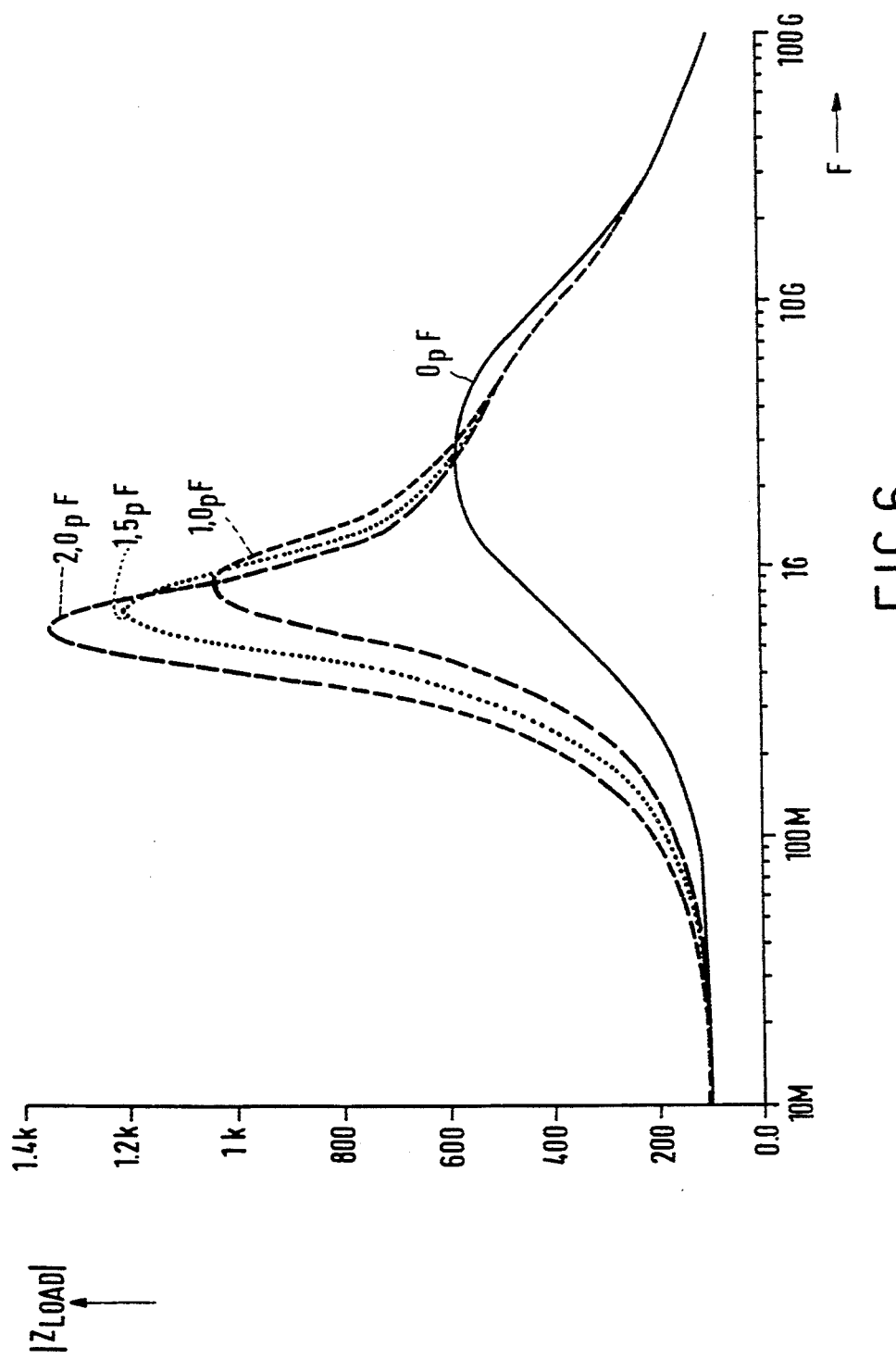
FIG. 6 shows the load impedance in the amplifier stages in the embodiment.

Due to the bandpass characteristic of the balanced amplifier stages, the loop gain in the oscillation loop was larger than one near resonance frequency f2 and simultaneously smaller than one near the unwanted resonance frequencies f1 and f3, as is shown in FIGS. 3A-3C. FIG. 6 shows the load impedance formed by the load transistors as a function of the frequency at a bootstrap capacitor value of 0, 1, 1.5 and 2 picoFarad in the oscillator described above. It will be evident from FIG. 6 that the bandpass characteristic of the balanced amplifier stages can be detuned by the bootstrap capacitors. Such a detuning is also possible by means of the bias resistors 130 and 230.

The gain in the passband can be varied by means of the bias current source 190. The differential pair transadmittance is substantially equal to the conductances of the amplifier transistors which increase with an increasing bias current. At an increasing bias current, the load impedance decreases only to a lesser extent so that, overall, the gain of the balanced amplifier stages increases.

Figure 7:
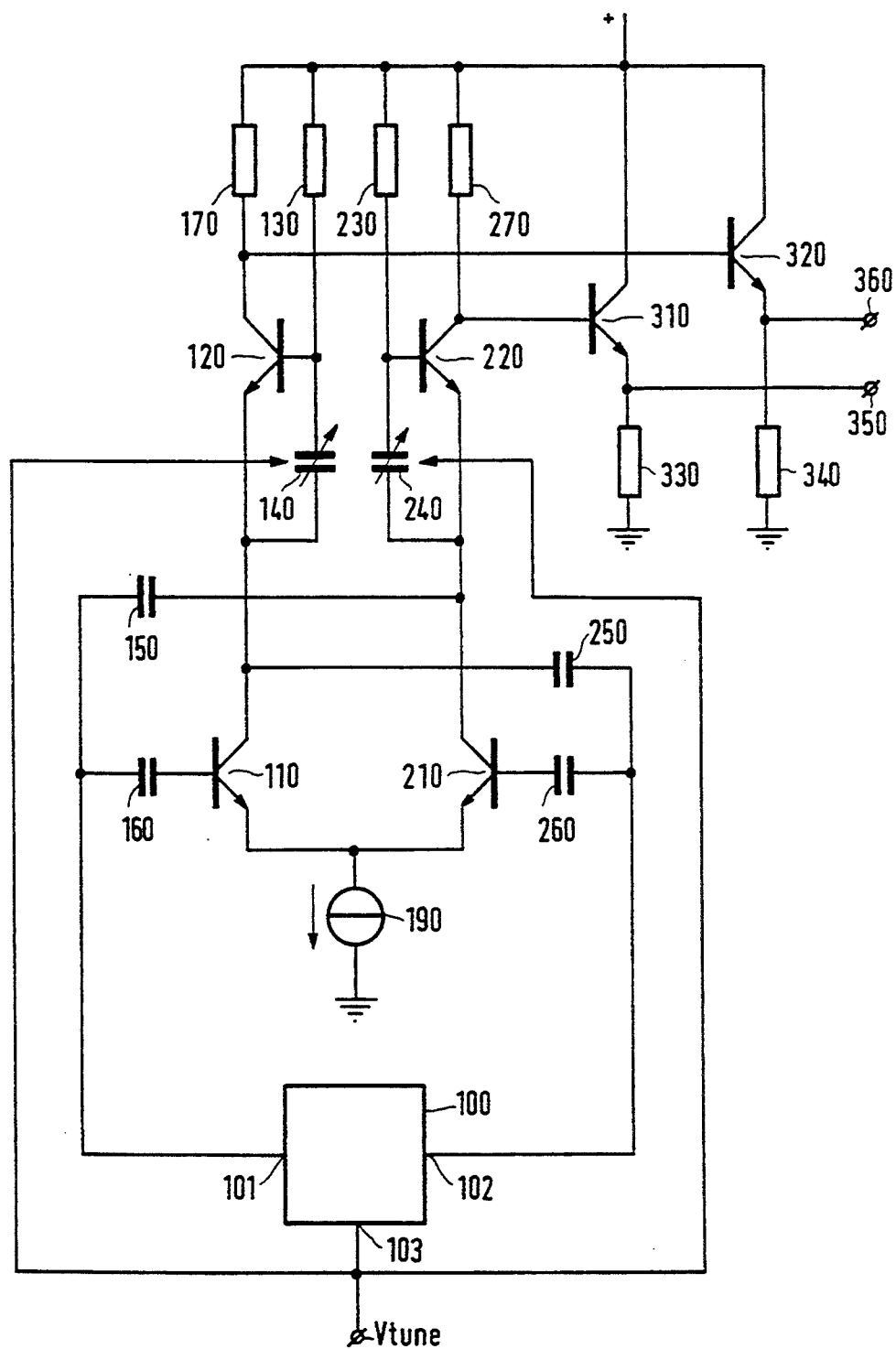
FIG. 7 shows a first modification of the embodiment of an oscillator according to the invention.
Figure 8:
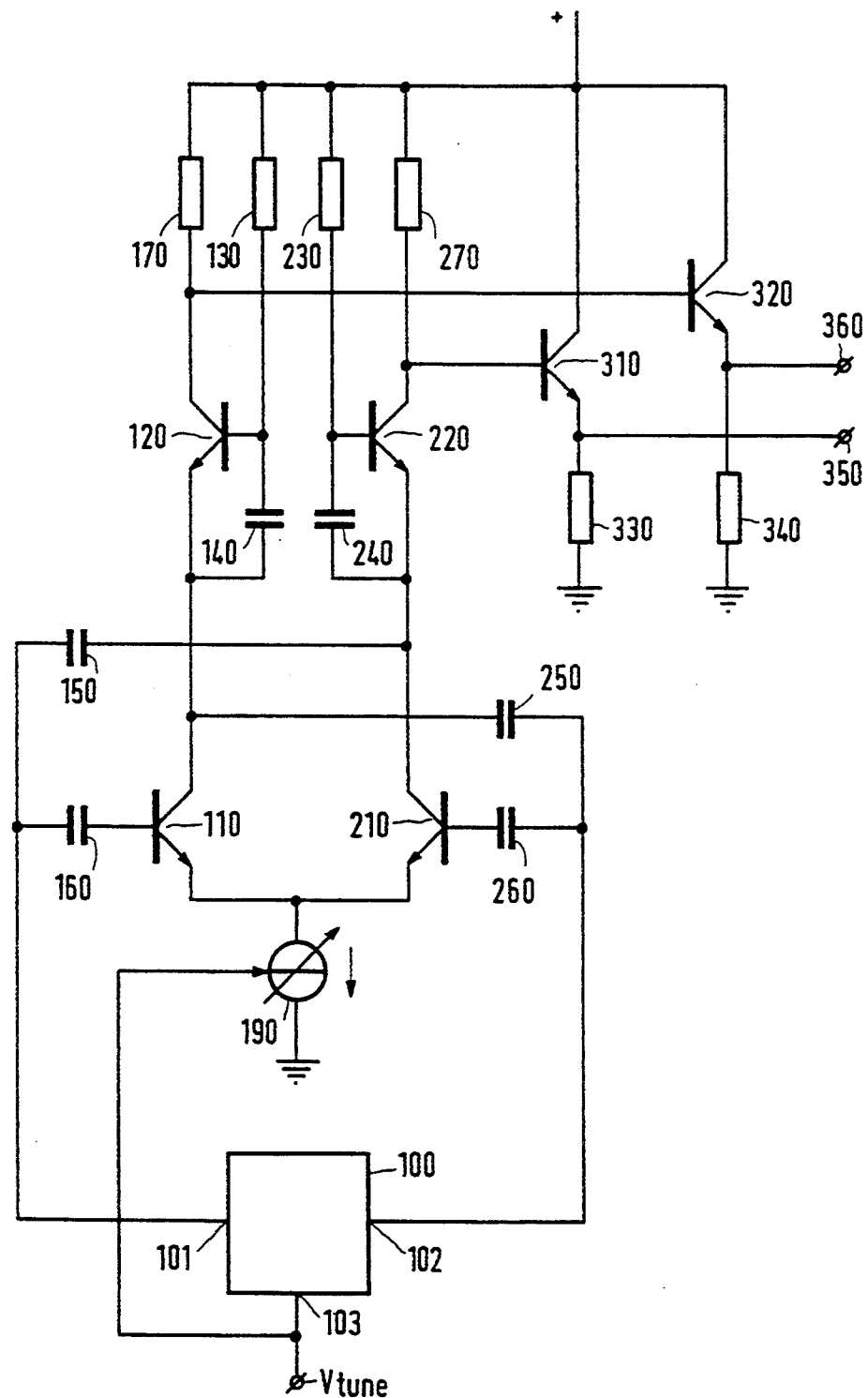
FIG. 8 shows a second modification of the embodiment of an oscillator according to the invention.
Figure 9:
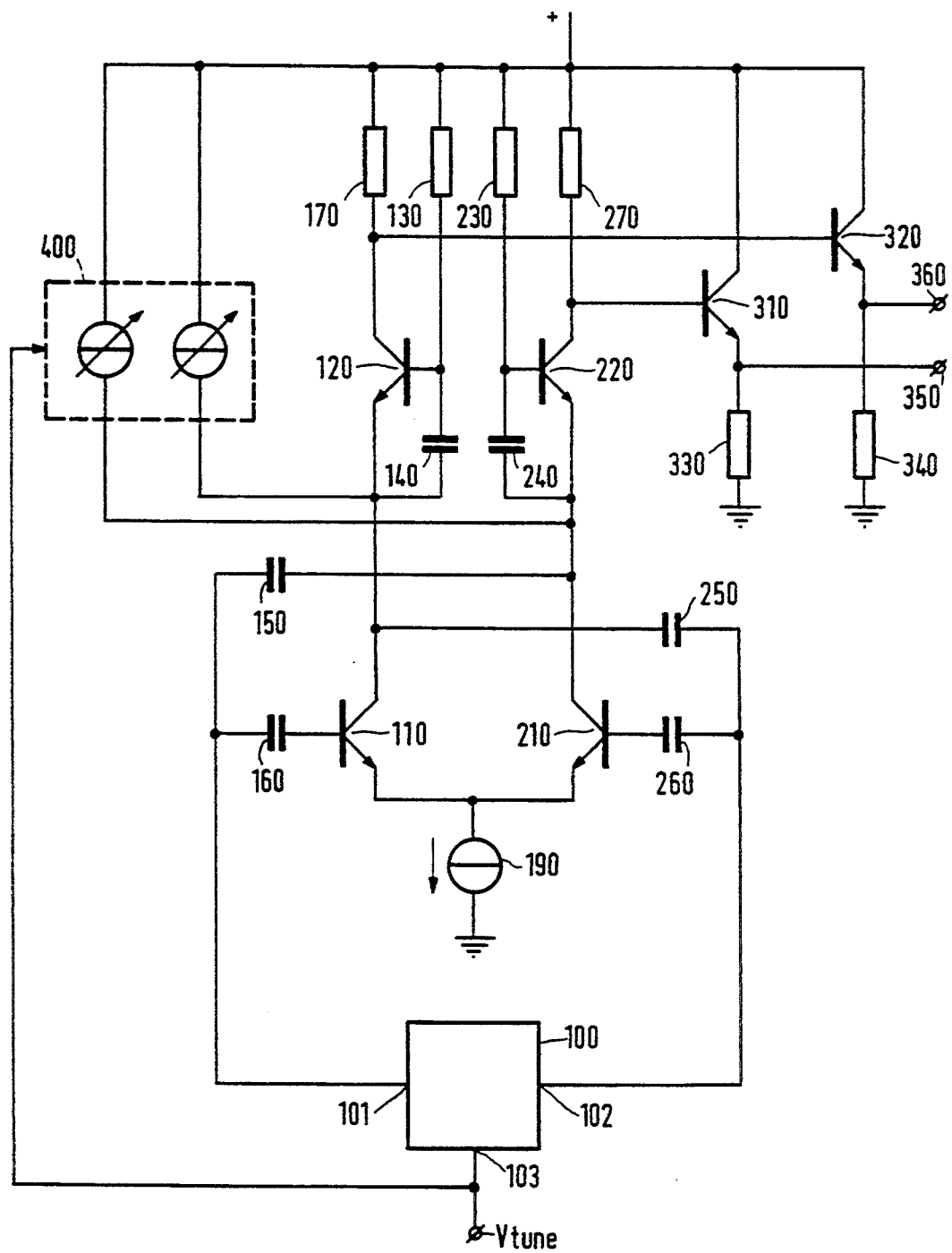
FIG. 9 shows a third modification of the embodiment of an oscillator according to the invention.

FIGS. 7, 8 and 9 show further embodiments making use of the foregoing. FIG. 7 shows an embodiment in which the value of the bootstrap capacitors 140 and 240 depends on the frequency control signal in order to adapt the location of the passband to the oscillation frequency.

In FIG. 8, the bias current supplied by current source 190 is dependent on the frequency control signal. The impedance between terminals 101 and 102 at the desired resonance frequency will not be constant in the desired oscillation frequency range when a practical tunable resonator is used. In order to inhibit a loop gain variation caused thereby, the gain of the balanced amplifier stages, which can be influenced via the current source 190, compensates such a variation of the resonator impedance. It is also possible to adapt the bias current from current source 190 as a function of the ambient temperature in order to compensate for the temperature dependence of components.

Figure 1:
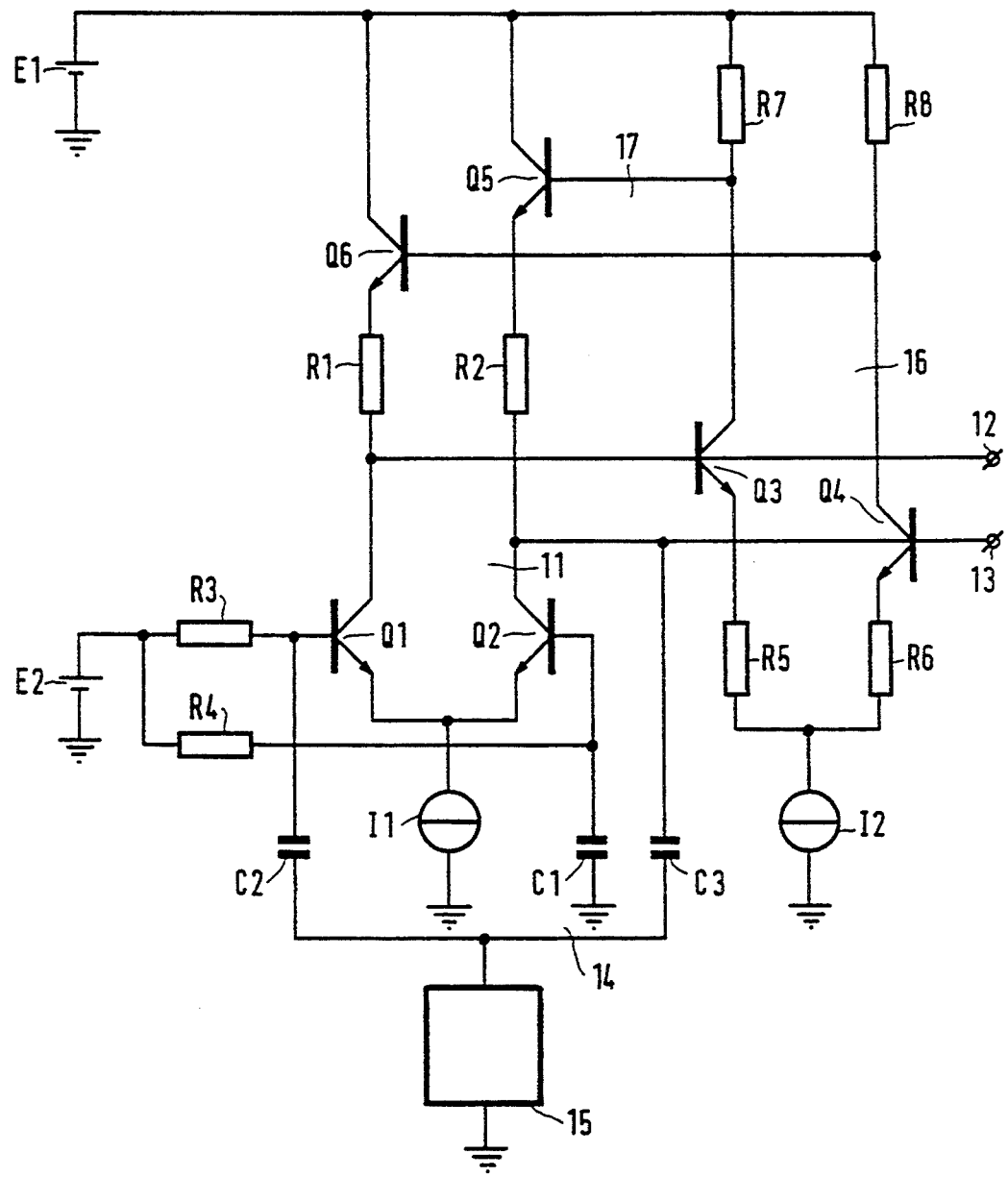
FIG. 1 shows the known oscillator.
Figure 2A:
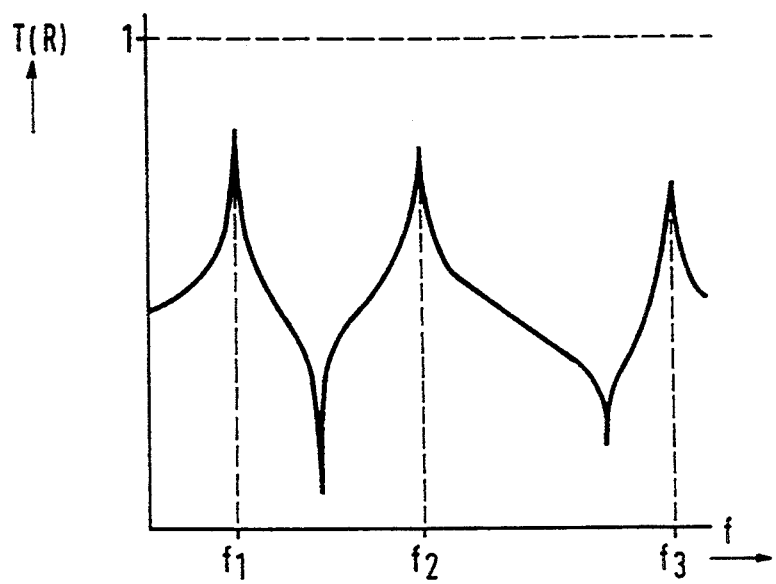
FIGS. 2A–2C show signal transfers in the oscillation loop of the known oscillator.
Figure 2B:
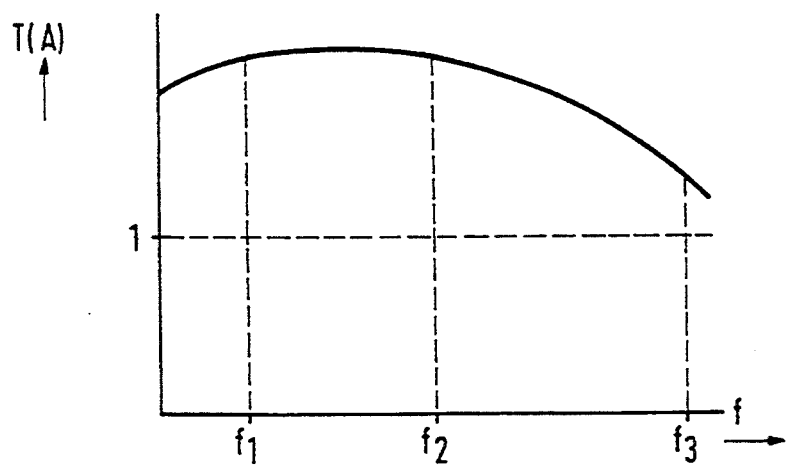
Figure 2C:
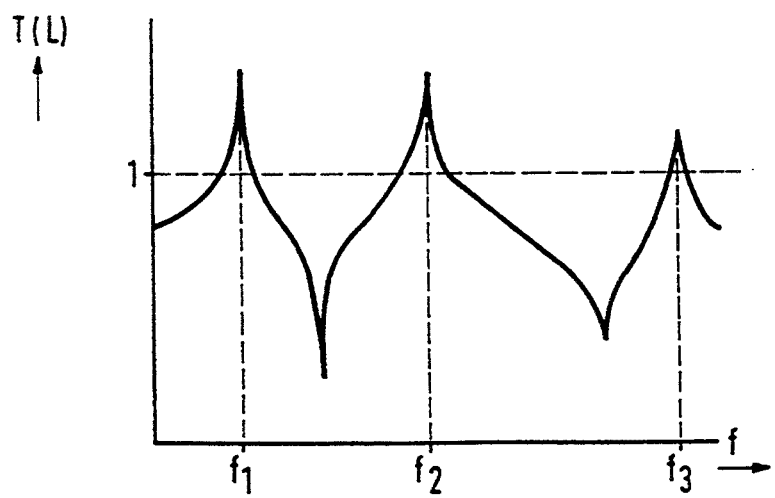

In the embodiment shown in FIG. 8, collector voltages of the amplifier transistors 110 and 210 vary to a comparatively small extent at a change of the bias current from current source 190. This bias current is consequently controllable in a relatively large range without the relevant oscillator reaching an unwanted state. This is in contrast to the known oscillator shown in FIG. 1. Dependent on the value of the load resistor R2 and resistor R1, amplifier transistor Q2 and driver transistor Q1 may be driven into saturation at a comparatively small increase of the bias current flowing from current source I1.

FIG. 9 shows an embodiment in which DC biasing means 400 are coupled to the load signal paths for removing a portion of the DC collector currents provided by the amplifier transistors 110 and 210. Accordingly, the load transistors 120 and 220 are biased at a lower current than said amplifier transistors. Advantageously, the load impedance provided by the load transistors 120 and 220 can be increased without simultaneously decreasing the transadmittance provided by the differential pair as in the embodiment shown in FIG. 8. At the same current consumption, a higher gain of the balanced amplifier stages can be obtained than that in the embodiments previously discussed. Moreover, the gain can be varied by adapting the portion of the DC collector currents that is removed by DC biasing means 400, for example, by means of the frequency control signal as shown in FIG. 9.

Referring to FIG. 5, said DC biasing means may comprise resistors, not shown, between the positive supply voltage rail and the collectors of the amplifier transistors 110 and 210, respectively. By varying the voltage at said collectors, the DC bias current of the load transistors 120 and 220 can be varied. The collector voltages can, for example, be varied by applying a control voltage to the bases of load transistors 120 and 220, for example, by disconnecting the terminals of the bias resistors 130 and 230 from the positive supply rail and applying said control voltage to these terminals. Alternatively, the control voltage could be applied at the bases of cascode transistors, not shown, which cascode transistors can be inserted between the amplifier transistors and the load transistors and, as such, become part of the load signal path.

This disclosure will enable those skilled in the art to conceive many alternative embodiments within the scope of the invention. For example, an oscillator according to the invention may be provided with additional amplifier stages, be it in balanced configuration or in series with the amplifier stage mentioned in the opening paragraph. Like the known oscillator shown in FIG. 1, said amplifier stage may be coupled to a driver transistor whose base is coupled to the resonator and whose emitter is coupled to the emitter of the amplifier transistor of said amplifier stage. A load signal path in the oscillator according to the invention may also comprise load resistors or other components, which is not the case in the embodiments shown in FIGS. 5, 7, 8 and 9.

It is not necessary that an oscillation signal generated in the oscillator is read in the manner as shown in FIGS. 5, 7, 8 and 9. For example, a differential amplifier may read the oscillation signal by coupling a first and a second input thereof to the base terminals of amplifier transistor 110 and amplifier transistor 210, respectively, or to other symmetrical points in the oscillation loop. In this alternative embodiment, the collectors of load transistors 120 and 220 may be connected directly to the power supply terminal so that read resistors 170 and 270 are dispensed with. Said differential amplifier may comprise, for example, two balanced amplifier stages similar to those of the oscillator shown in FIG. 5.

The passive capacitive coupling in the oscillator according to the invention can be realized in numerous different ways. For example, in the oscillator shown in FIG. 5, a further resistor can be inserted between the base terminal of transistor 120 and the common node of resistor 130 and bootstrap capacitor 140, together with an additional bootstrap capacitor across the base-emitter terminals of transistor 120. The same holds for transistor 220. Such a coupling then comprises three capacitive signal paths from the load signal path to the base of the load transistor: one via the emitter-base capacitance, one via a first bootstrap capacitor and one via a second bootstrap capacitor. It is also possible to arrange a resistor in series with a bootstrap capacitor, or to arrange an extra capacitor between the base and the collector of a load transistor.

The frequency control signal, with which the bootstrap capacitors or the DC bias can be controlled, need not be derived from the frequency control signal applied to the resonator. If the oscillation frequency is adjustable by means of a synthesizer circuit, the data for the frequency adjustment applied thereto may alternatively be used for adapting the bootstrap capacitance or the bias currents of the oscillator. This modification of the embodiment is notably interesting when the oscillator and the synthesizer circuit can be jointly arranged on one integrated circuit.

Finally it is to be noted that the bipolar transistors shown in the embodiments can be replaced by field-effect transistors, in which emitter, collector and base terminals correspond to source, drain and gate terminals, respectively. Although the transistors shown in the Figures are of the NPN type, it is possible to use bipolar PNP transistors or P-channel field effect-transistors. When a field-effect load transistor is used, it is preferable to arrange a resistor between the gate terminal and a bootstrap capacitor so as to obtain the previously described effect caused by the base resistance of a load transistor.

In summary, what has been proposed is an oscillator which inhibits unwanted oscillations and requires a comparatively small power supply voltage. The oscillator comprises an amplifier transistor 110 (220), an output current of which flows into the emitter of a load transistor 120 (220) via a load signal path. The amplifier stage acquires a bandpass characteristic by means of a passive capacitive bootstrap signal transfer from this signal path to the base of the load transistor. The oscillator thus preferably oscillates within the passband of the amplifier stage. The amplifier stage has a comparatively large gain within the passband, even without a load resistor in the load signal path. Such a load resistor would cause a voltage drop and, hence, increase the required power supply voltage.

I claim:

1. An oscillator including a resonator which is coupled to an amplifier stage comprising an amplifier transistor and a load transistor, a load signal path from a collector of the amplifier transistor to an emitter of the load transistor, to which load signal path the resonator is coupled, and a bootstrap signal transfer from the load signal path to the base of the load transistor, which base is coupled to a reference voltage conductor via a bias resistor, characterized in that the bootstrap signal transfer is mainly determined by a passive capacitive coupling of the base of the load transistor to the load signal path.

2. An oscillator as claimed in claim 1, characterized in that a bootstrap capacitor is arranged between the base terminal and the emitter terminal of the load transistor.

3. An oscillator as claimed in claim 2, characterized in that at least one bootstrap capacitor is adjustable by means of a frequency control signal.

4. An oscillator as claimed in claim 1, characterized in that a device for DC biasing of the amplifier stage is adjustable by means of a frequency control signal.

5. An oscillator as claimed in claim 1, characterized in that DC biasing means are coupled to the load signal path for removing a portion of the DC collector current of the amplifier transistor such as to bias the load transistor at a lower current than the amplifier transistor.

6. An oscillator as claimed in claim 1, characterized in that the collector of the load transistor is coupled to a reference voltage conductor via a read resistor and is further coupled to an output terminal of the oscillator.

7. An oscillator as claimed in claim 1, characterized in that it comprises two amplifier stages arranged in a balanced configuration, the emitters of the amplifier transistors being interconnected such that said amplifiers transistors constitute a differential pair.

8. An oscillator as claimed in claim 2, characterized in that a device for DC biasing of the amplifier stage is adjustable by means of a frequency control signal.

9. An oscillator as claimed in claim 3, characterized in that a device for DC biasing of the amplifier stage is adjustable by means of a frequency control signal.

10. An oscillator as claimed in claim 2, characterized in that DC biasing means are coupled to the load signal path for removing a portion of the DC collector current of the amplifier transistor such as to bias the load transistor at a lower current than the amplifier transistor.

11. An oscillator as claimed in claim 3, characterized in that DC biasing means are coupled to the load signal path for removing a portion of the DC collector current of the amplifier transistor such as to bias the load transistor at a lower current than the amplifier transistor.

12. An oscillator as claimed in claim 8, characterized in that DC biasing means are coupled to the load signal path for removing a portion of the DC collector current of the amplifier transistor such as to bias the load transistor at a lower current than the amplifier transistor.

13. An oscillator as claimed in claim 9, characterized in that DC biasing means are coupled to the load signal path for removing a portion of the DC collector current of the amplifier transistor such as to bias the load transistor at a lower current than the amplifier transistor.

14. An oscillator as claimed in claim 2, characterized in that the collector of the load transistor is coupled to a reference voltage conductor via a read resistor and is further coupled to an output terminal of the oscillator.

15. An oscillator as claimed in claim 3, characterized in that the collector of the load transistor is coupled to a reference voltage conductor via a read resistor and is further coupled to an output terminal of the oscillator.

16. An oscillator as claimed in claim 4, characterized in that the collector of the load transistor is coupled to a reference voltage conductor via a read resistor and is further coupled to an output terminal of the oscillator.

17. An oscillator as claimed in claim 2, characterized in that it comprises two amplifier stages arranged in a balanced configuration, the emitters of the amplifier transistors being interconnected such that said amplifiers transistors constitute a differential pair.

18. An oscillator as claimed in claim 3, characterized in that it comprises two amplifier stages arranged in a balanced configuration, the emitters of the amplifier transistors being interconnected such that said amplifiers transistors constitute a differential pair.

19. An oscillator as claimed in claim 4, characterized in that it comprises two amplifier stages arranged in a balanced configuration, the emitters of the amplifier transistors being interconnected such that said amplifiers transistors constitute a differential pair.

20. An amplifier stage comprising an amplifier transistor and a load transistor, a load signal path from a collector of the amplifier transistor to an emitter of the load transistor, and a bootstrap signal transfer from the load signal path to the base of the load transistor which base is coupled to a reference voltage conductor via a bias resistor, characterized in that the bootstrap signal transfer is mainly determined by a passive capacitive coupling of the base of the load transistor to the load signal path.

* * * * *